United States Patent
Temchenko

(10) Patent No.: US 7,880,863 B2
(45) Date of Patent: Feb. 1, 2011

(54) LITHOGRAPHY SYSTEM WITH ILLUMINATION MONITOR

(75) Inventor: Vlad Temchenko, Dresden (DE)

(73) Assignee: Infineon Technologies AG, Neubiberg (DE)

(*) Notice: Subject to any disclaimer, the term of this patent is extended or adjusted under 35 U.S.C. 154(b) by 289 days.

(21) Appl. No.: 12/017,881

(22) Filed: Jan. 22, 2008

(65) Prior Publication Data

US 2009/0185155 A1  Jul. 23, 2009

(51) Int. Cl.
G03B 27/72 (2006.01)
G03B 27/54 (2006.01)

(52) U.S. Cl. .......................... 355/71; 355/67
(58) Field of Classification Search .................. 355/53, 355/55, 67–71; 250/548; 356/399–401
See application file for complete search history.

(56) References Cited

U.S. PATENT DOCUMENTS

| | | | |
|---|---|---|---|
| 5,005,952 | A | 4/1991 | Clark et al. |
| 5,440,390 | A | 8/1995 | Tirri |
| 6,078,393 | A | 6/2000 | Oohashi et al. |
| 6,211,957 | B1 | 4/2001 | Erdogan et al. |
| 6,384,899 | B1 | 5/2002 | den Boef |
| 6,689,519 | B2 | 2/2004 | Brown et al. |
| 6,816,260 | B2 * | 11/2004 | Peupelmann et al. ........ 356/364 |
| 7,085,052 | B2 | 8/2006 | Patel et al. |
| 7,245,355 | B2 * | 7/2007 | Mulkens et al. ............... 355/67 |
| 2007/0242256 | A1 * | 10/2007 | Van De Kerkhof ........... 355/71 |

OTHER PUBLICATIONS

Kye et al., Polarization aberration analysis in optical lithography systems, Optical Microlithography XIX, vol. 6154, 2006, 11 pages.
McIntyre et al., Experimental Verification of PSM Polarimetry: Monitoring Polarization at 193-nm High-NA with Phase-Shaft Masks.

* cited by examiner

*Primary Examiner*—Hung Henry Nguyen
(74) *Attorney, Agent, or Firm*—Dicke, Billig & Czaja, PLLC

(57) ABSTRACT

A lithographic system including a light source configured to provide a light beam, a mask stage configured to hold a mask having a mask pattern, a wafer stage having a surface configured to hold a wafer having a plurality of dies, and an illumination monitor having a receiver disposed at the surface of the wafer stage and a polarimeter. A projection system is configured to shape and direct the light beam via the mask pattern to form an exposure beam and to individually expose each die with the exposure beam, and is configured to shape and direct the light beam to form a monitor beam and to expose the receiver with the monitor beam. The receiver is configured to communicate the monitor beam to the polarimeter which, based on the monitor beam, is configured to provide an illumination signal representative of properties of the light beam as it passes through the lithographic system.

21 Claims, 6 Drawing Sheets

US 7,880,863 B2

LITHOGRAPHY SYSTEM WITH ILLUMINATION MONITOR

BACKGROUND

Semiconductor fabrication processes typically involve a number of lithography steps to form various features and multiple levels of integrated circuit (IC) semiconductor devices. Lithography involves transferring a pattern from a reticle, or mask, disposed above a semiconductor substrate (e.g. a wafer) to a resist material on the semiconductor substrate. As the size of integrated circuit features continues to shrink, the minimum feature size which may be successfully fabricated becomes limited by performance characteristics of the lithography process, such as its resolution capability.

That said, advancements have been made in the resolution of photo lithography systems which have enabled continued improvements in integrated circuit (IC) production. The resolution (R) of lithographic pattern transfer is commonly defined as: $R=k_1(\lambda/NA)$; where $\lambda$ is the wavelength of the exposing light (i.e. the exposure wavelength), NA is the numerical aperture, and $k_1$ represents various process-dependent factors. To date, such resolution enhancements have been achieved primarily through decreases in the exposure wavelength and increases in the numerical aperture. A 193-nm exposure wavelength has been the industry standard for several years and dry lithography systems employ lens NAs exceeding 0.90, very close to the dry numerical aperture limit of 1.0. Thus, to further improve resolution for IC production, process-dependent factors ($k_1$) of dry lithography systems will need to be further optimized, or other techniques, such as immersion lithography systems, will need to be employed.

Both high NA and immersion lithography systems employ polarized light to enhance image contrast which, in turn, improves resolution. As such, polarization represents one process-related ($k_1$) factor which can be controlled to provide increased system resolution. Heightened image contrast also reduces the sensitivity of the lithography process to deviations in focus errors thereby extending process latitude.

To employ polarization as a resolution enhancement technique, information describing the polarization state, as well as other characteristics (e.g. intensity, distribution) of the exposing light at the wafer plane is desired. Present polarization metrology techniques include employing a large polarimeter in the optical path of the illumination system (e.g. via a beam splitter) or a specially designed PSM (phase shifting mask) reticle. However, such optical path polarimeters do not provide polarization state information at the wafer plane, and PSM reticles cannot be integrated into run-to-run metrology.

SUMMARY

One embodiment provides a lithographic system including a light source configured to provide a light beam, a mask stage configured to hold a mask having a mask pattern, a wafer stage having a surface configured to hold a wafer having a plurality of dies, and an illumination monitor having a receiver disposed at the surface of the wafer stage and a polarimeter. A projection system is configured to shape and direct the light beam via the mask pattern to form an exposure beam and to individually expose each die with the exposure beam, and is configured to shape and direct the light beam to form a monitor beam and to expose the receiver with the monitor beam. The receiver is configured to communicate the monitor beam to the polarimeter which, based on the monitor beam, is configured to provide an illumination signal representative of properties of the light beam as it passes through the lithographic system.

BRIEF DESCRIPTION OF THE DRAWINGS

The accompanying drawings are included to provide a further understanding of the embodiments and are incorporated in and constitute a part of this specification. The drawings illustrate embodiments and together with the description serve to explain the principles of the embodiments. Other embodiments and many of the intended advantages will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments which may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the embodiments. The following detailed description, therefore, is not to be taken in a limiting sense, and the scope of the embodiments is defined by the appended claims.

Figure 1:
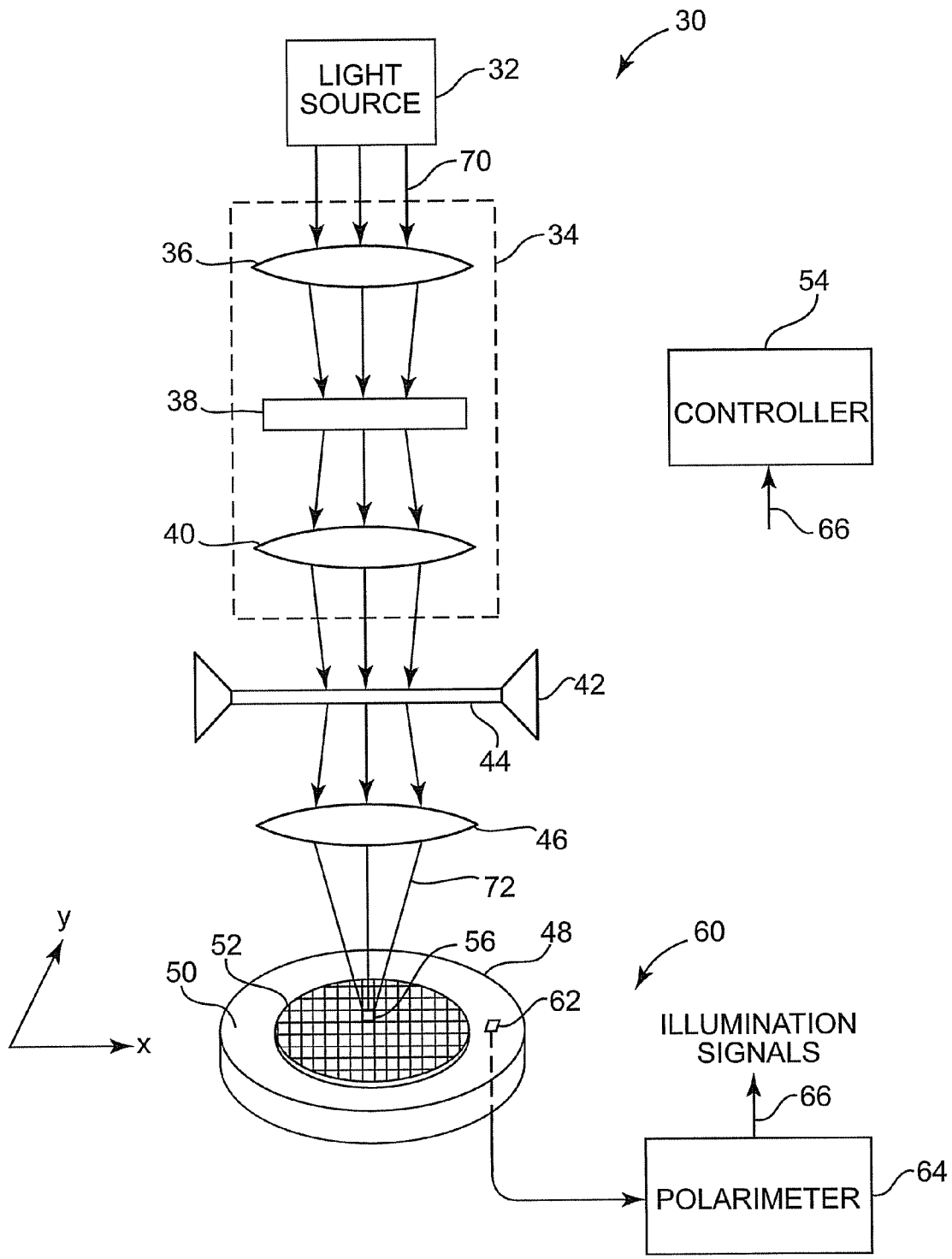
FIG. 1 is a block and diagram generally illustrating a lithographic system according to one embodiment.

FIG. 1 is block diagram generally illustrating a lithographic projection system 30 having an integrated wafer-plane illumination monitor according to one embodiment. Lithographic projection system 30 includes a light source 32, source optics 34, a moveable mask stage 42 configured to hold a mask or reticle 44, projection optics 46, a moveable wafer stage 48 having a surface 50 configured to receive and secure a substrate thereon, such as a wafer 52, and a controller 54. In one embodiment, source optics 34 further includes a first condenser lens 36, an aperture plate 38, and a second condenser lens 40. As will be described below, source and projection optics 34 and 46 together form a portion of a projection system for directing and focusing light provided by light source 32 onto each of a plurality of dies 56 on wafer 52 so as to individually expose or image each die 56.

Lithographic projection system 30 further includes an integrated wafer-plane illumination monitor 60. According to embodiments described herein, illumination monitor 60 enables monitoring of properties of the light provided by light source 32 to expose the dies 56 (e.g. polarization state, intensity, across-field distribution) at one or more locations within lithographic system 30 (e.g. surface of mask 44, surface 50 of wafer stage 48). According to one embodiment, as illustrated by FIG. 1, illumination monitor 60 includes a receiver 62 integral to wafer stage 48 and a polarimeter 64, with receiver 62 being configured to receive and provide to polarimeter 64 a sample of light generated by lithographic system 30 to expose wafer 52.

In one embodiment, receiver 62 is positioned so as to be substantially flush with surface 50 of wafer stage 48 at a location outside the boundaries of wafer 52. In one embodiment, receiver 62 has boundaries or dimensions (e.g. a length and width) that are substantially equal to the dimensions of the dies 56 of wafer 52. In one embodiment, receiver 52 has boundaries at least equal to the dimensions of a largest die 56 expected to be exposed by lithographic system 30.

Embodiments of the operation of lithographic projection system 30 are described below with reference to FIGS. 1 and 2. Light source 32 is configured to generate a beam of radiation or light beam along an optical path 70. In one embodiment, the light beam has a 193 nm wavelength. As such, in one embodiment, light source 32 comprises a 193 nm wavelength source, such as a 193 nm Argon Flouride (ArF) excimer laser, for example. In other embodiments, light source 32 comprises other suitable light sources, such as a 248 nm wavelength Krypton Flouride (KrF) excimer laser, for example.

In general, source optics 34 are configured as beam-shaping optics and are configured to filter, condition, and align light from light source 32 so as to provide a light beam having a substantially uniform polarity and intensity distribution to reticle 44 along optical path 70. First condenser lens 36 collects light from light source 32 and is configured to provide uniform illumination of aperture plate 38 via optical path 70. Aperture plate 38 includes a desired aperture pattern (e.g. dipole, quadripole plates) designed to increase the resolution and depth of focus of the lithography process and to shape the light beam. Second condenser lens 40 collects light from aperture plate 54 and is configured to project a uniform light beam having a desired shape onto mask 44 along optical path 70.

As described below, lithographic system 30 can operate in various modes, such as a step mode, a scan mode, or a combination thereof. When operating in a step mode, source optics 34 provides a rectangular-shaped beam similar to that of dies 56. When operating in a scan mode, source optics 34 provides a slit or line-like light beam which is perpendicular to a scanning direction.

Mask 44 includes a mask pattern, such as a desired IC pattern, to be exposed or imaged onto each of the dies 56 of wafer 52. In one embodiment, mask 44 comprises a chromium mask pattern on quartz. Mask stage 42 is moveably controlled by a positioning means (e.g. controller 54) to accurately position mask 44 relative to projection optics 46. After passing through mask 44, projection optics 46 focus the light beam to form an exposure beam 72, which is representative of the mask pattern, and which is focused onto an exposure target area, such as a selected die 56. In one embodiment, projection optics 46 employs a reduction factor (e.g. 4×, 5×, 10×) such that the projected image of the mask pattern on die 56 is smaller that the mask pattern on mask 44.

Wafer stage 48 can be accurately moved so as to position different exposure target areas of wafer 52 and mask stage 42 can be moved to accurately position mask 44 with respect to optical path 70, such as after retrieval of mask 44 from a mask library, or during a mask scan. Various techniques (not explicitly described herein) can be employed and controlled by lithographic system 30, such as via controller 54, to accurately move and align mask and wafer stages 42 and 48, such as interferometric displacement techniques, for example.

As described above, lithographic system 30 may operate in various modes including, for example, a step mode and a scan mode. In step mode, mask stage 42 is kept essentially stationary and an entire mask pattern (e.g. IC pattern) on mask 44 is simultaneously projected or imaged (i.e. in a single "flash") onto an exposure target area, such as die 56. Wafer stage 48 is then shifted in the x and/or y directions so that a different die 56 can be exposed by exposure beam 72.

In scan mode, the same basic process applies as for step mode, except that a selected target exposure area is not exposed in a single "flash". Instead, mask stage 48 is movable in a given direction (the so-called "scan direction"), such as the x direction, at a first speed so that the line- or slit-like light beam provided by source optics 34 is caused to move or scan over the mask pattern on mask 44. Concurrent with movement of mask stage 42, wafer stage 48 is moved the same or opposite direction at a second speed, which is based on the first speed and magnification of projection optics 46, so that exposure beam 72 scans across a die 56. In this fashion, a die area 56 having relatively large dimensions can be exposed or imaged without compromising resolution.

It is noted that in step mode, exposure beam 72 has a rectangular shape having the same dimensions as those of die 56, and a slit- or line-like shape in scan mode. In general, regardless of the mode of operation, a series of successive exposures of mask patterns of a series of masks 44 is applied to each die 56 of wafer 52 to form desired IC patterns in the various semiconductor layers of each die 56. These IC patterns are overlayed and vertically connected to ultimately form the desired IC for each die 56.

As described above, to fabricate the ever-decreasing size of the features of the IC patterns, high-NA and immersion lithography systems employ polarized light to improve system resolution. However, many factors can dynamically and adversely affect the properties of the light used to expose wafer 56 as it is generated by and passes through lithography system 30 (e.g. intensity, polarization state, across-field uniformity) and thus, dynamically and adversely impact the resolution of the system. For example, light source 32 (e.g. a 193 nm Argon Flouride excimer laser) may deteriorate over time, resulting in variations in its intensity (e.g. decrease in intensity) and increased variations in the wavelength provided.

Also, even though monitored (although less frequently than a production run of wafers) and cooled during operation, the lenses forming source and projection optics 34 and 46 are heated by the ultraviolet (UV) wavelengths and tend to expand, resulting in focus drift. Additionally, due to absorption of light, mask 44 may deteriorate over time, resulting in a loss of resolution of the projected mask pattern. Each of these factors, as well as the particular type of aperture plate 38 employed, affects the properties of the light as it is generated by and passes through lithography system 30, including exposure beam 72, and the system resolution.

Although some lithographic systems presently employ polarized light to increase system resolution, such as immersion and high-NA systems, such systems are not known to actively monitor or control the polarization state of the exposing light.

Figure 2:
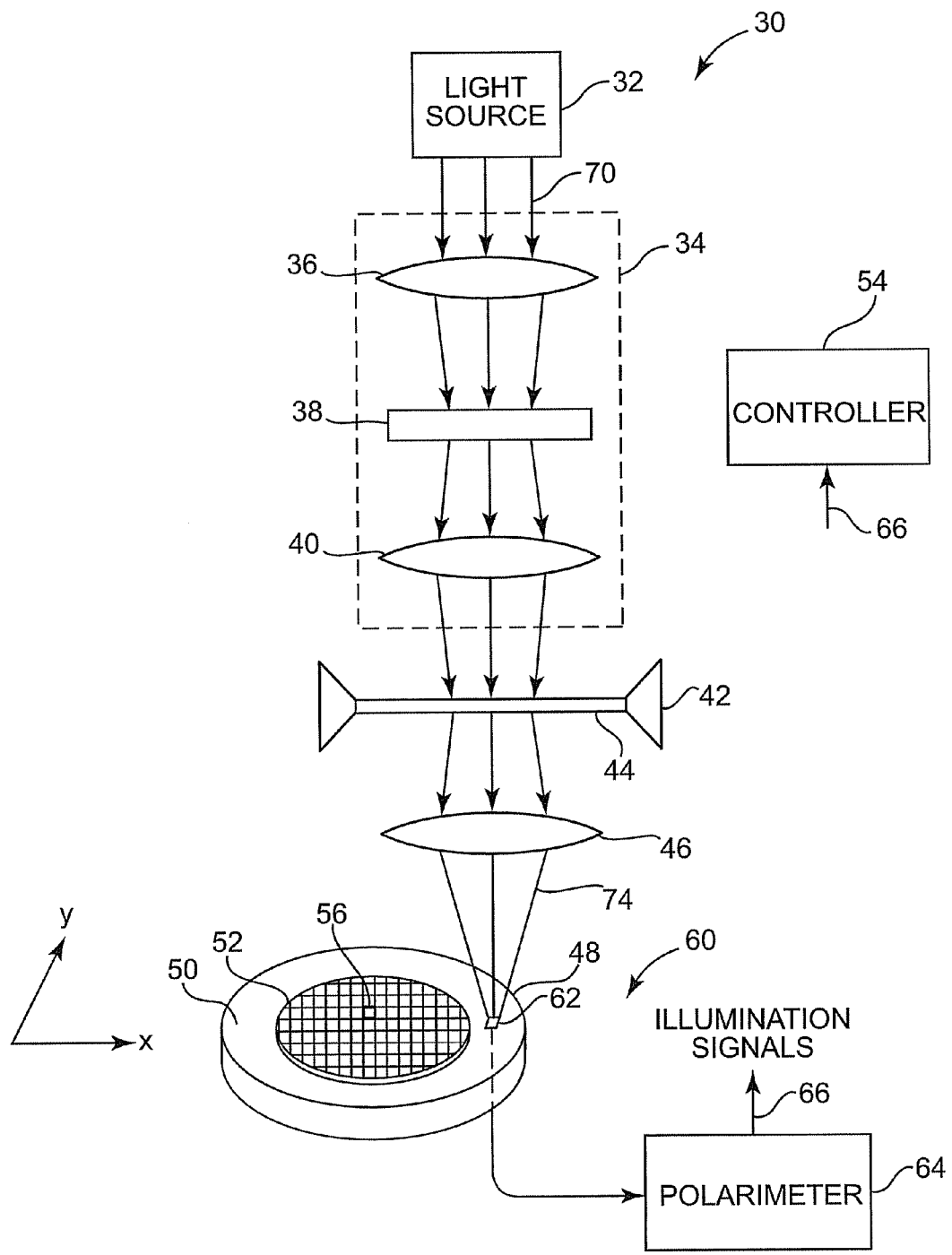
FIG. 2 is a block diagram generally illustrating the operation of the lithographic system of FIG. 1 according to one embodiment.

According to one embodiment, as illustrated by FIG. 2, during a process of exposing or imaging the dies 56 of wafer 52 with exposure beam 72, lithographic system 30 provides and irradiates or exposes receiver 62 with a monitoring beam 74. In one embodiment, monitor beam 74 is the same the as exposure beam 72 (i.e. formed by directing the light beam through the mask pattern of mask 44 so as to be representative of the mask pattern). In such an embodiment, illumination monitor 60 and monitor beam 74 together enable monitoring of the properties of diffracted light at the level of wafer 52. For example, non-polarized light incident upon mask 44 will become linearly polarized when passed through a chrome-on-glass grating, such as alternating lines and spaces of the mask pattern of mask 44.

In one embodiment, monitor beam 74 is formed by bypassing the mask pattern, such as by directing the light beam through a through a clear quartz area of mask 44 or by bypassing mask 44 altogether. In such an embodiment, illumination monitor 60 and monitor beam 74 together enable monitoring of the properties of incident light at the level of mask 44, such as polarization state and intensity, for example.

In one embodiment, when operating in a step mode of operation and in a fashion similar to that described above with respect to dies 56, at least a portion of receiver 62 having dimensions substantially equal to dimension of die 56 is exposed in a single "flash" by monitor beam 72. Similarly, when operating in a scan mode, line- or slit-like monitor beam 74 is moved or scanner over receiver 62. In essence, receiver 62 is treated as another die 56 during the exposure process of wafer 52. In one embodiment, receiver 62 is exposed each time the plurality of dies 56 of wafer 52 are exposed (i.e. once for each mask pattern imaged onto the plurality of dies 56).

Regardless of the mode of operation of lithographic system 30, as receiver 62 is exposed by monitor beam 72, receiver 62 communicates/provides the received light of monitor beam 74 to polarimeter 64. In one embodiment (as will be described in greater detail below with respect to FIGS. 3-5), receiver 62 is configured to receive discrete samples of monitor beam 74 at a plurality of predetermined locations within the boundaries of receiver 62 and to individually communicate/provide each of the discrete samples to polarimeter 64. Polarimeter 64, in-turn, provides a plurality of illumination signals 66 for each of the discrete samples, with each of the plurality of signals being indicative of properties of the corresponding discrete sample of monitor beam 74 (e.g. polarization state, intensity). For example, in one embodiment, polarimeter 64 generates at least four illumination signals for each of the discrete samples of monitor beam 74 (see FIG. 5).

In one embodiment, a controller, such as controller 54, receives each plurality of illumination signals from polarimeter 64, and determines properties of each of the discrete samples of monitor beam 74. For example, in one embodiment, when monitor beam 74 comprises exposure beam 72 (i.e. is directed through the mask pattern), controller 54 determines the polarization state and intensity of each of the discrete samples of monitor beam 74, which are representative of such properties of the exposure beam 72 incident upon wafer 52. In one embodiment, when monitor beam 74 bypasses the mask pattern, controller 54 determines the polarization state and intensity of each of the discrete samples of monitor beam 74, which are representative of such properties of light incident upon mask 44. Additionally, by receiving discrete samples of monitor beam 74 at the plurality of predetermined locations within the boundaries of receiver 62, controller 54 can determine the across-field distribution of monitor beam 72, and thus the across-field exposure at mask 44.

By monitoring such properties over time, such as the polarization state, various aspects of lithographic system 30 can be tracked such as effects arising from lens heating, light source stability, optical system alignment, environmental variables, and source polarization state, to name a few. A complex polarization imprint of exposure beam 72 obtained from the plurality of discrete samples can account for the quality of a lithographic reticle, such as mask 44, and stability of illumination settings.

In one embodiment, not only are such properties monitored and tracked, but based on the determined properties, controller 54 is configured to adjust one or more parameters of lithographic system 30 so as to adjust and achieve properties at desired levels or within a range of levels (i.e. to achieve desired operating conditions for lithographic system 30). As such, illumination monitor 60 and controller 54 together form a feedback loop for adjusting the operating parameters of lithographic system based on the monitored parameters of the light beam as it passes through lithographic system 30.

For example, in one embodiment, based on the across-field intensity, controller 54 adjusts source optics 34 to change the portion of the lens(es) being used. In one embodiment, controller 54 may indicate employing a different a type of aperture plate 38 so as to adjust the polarization state of exposure beam 72. In one embodiment, controller 54 repositions the mask and wafer stages 42 and 48 and/or the alignment of source and projection optics 34 and 46 so as to adjust the polarization state of exposure beam 72 at the plane of wafer 52. In one embodiment, controller 54 adjusts a tilt of wafer stage 48 based on the determined properties.

It is noted that, in addition to those described above, other components and parameters of lithographic system 30, such as illumination conditions and environmental conditions (e.g. temperature and humidity), may be adjusted by controller 54 based on the determined properties of monitoring beam 74.

Figure 3:
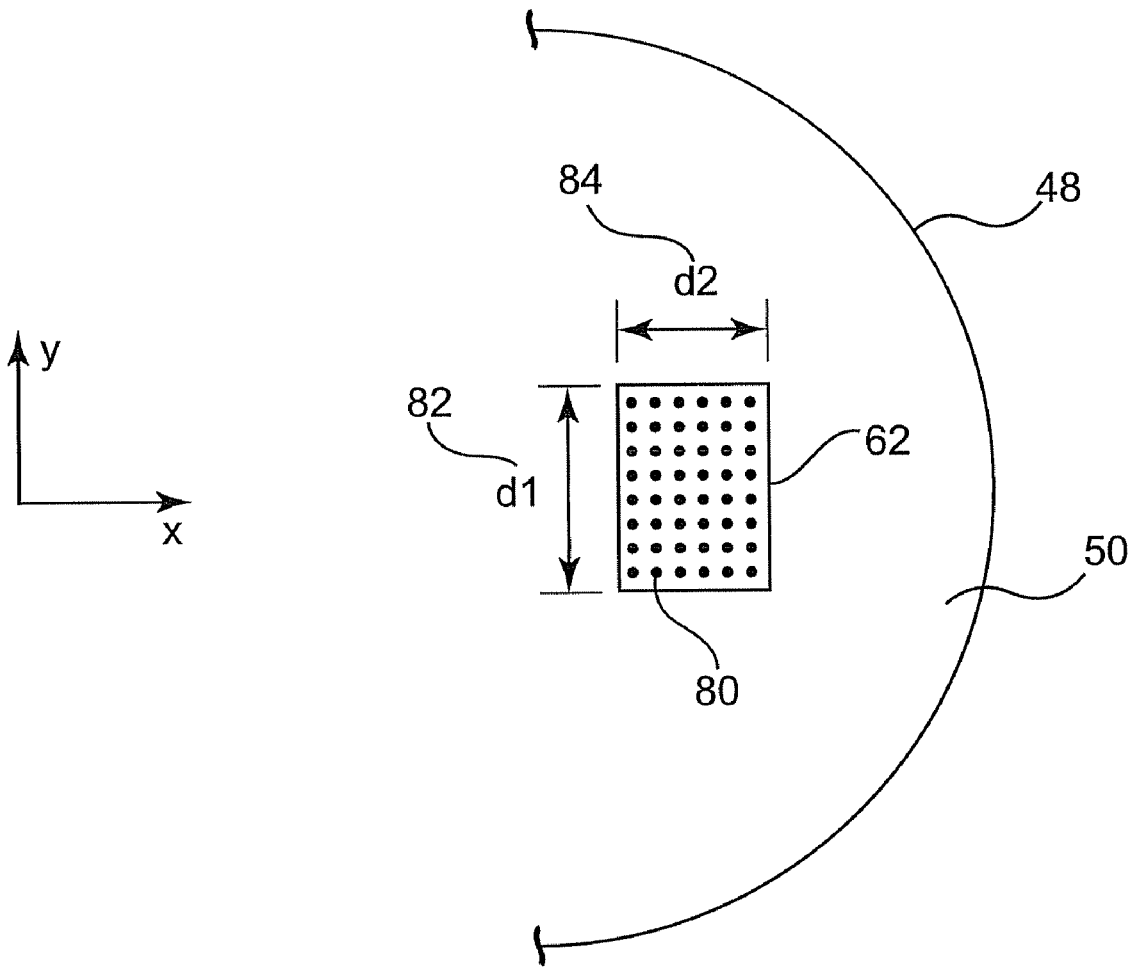
FIG. 3 is a top view illustrating a portion of a wafer stage and a receiver according to one embodiment.
Figure 4:
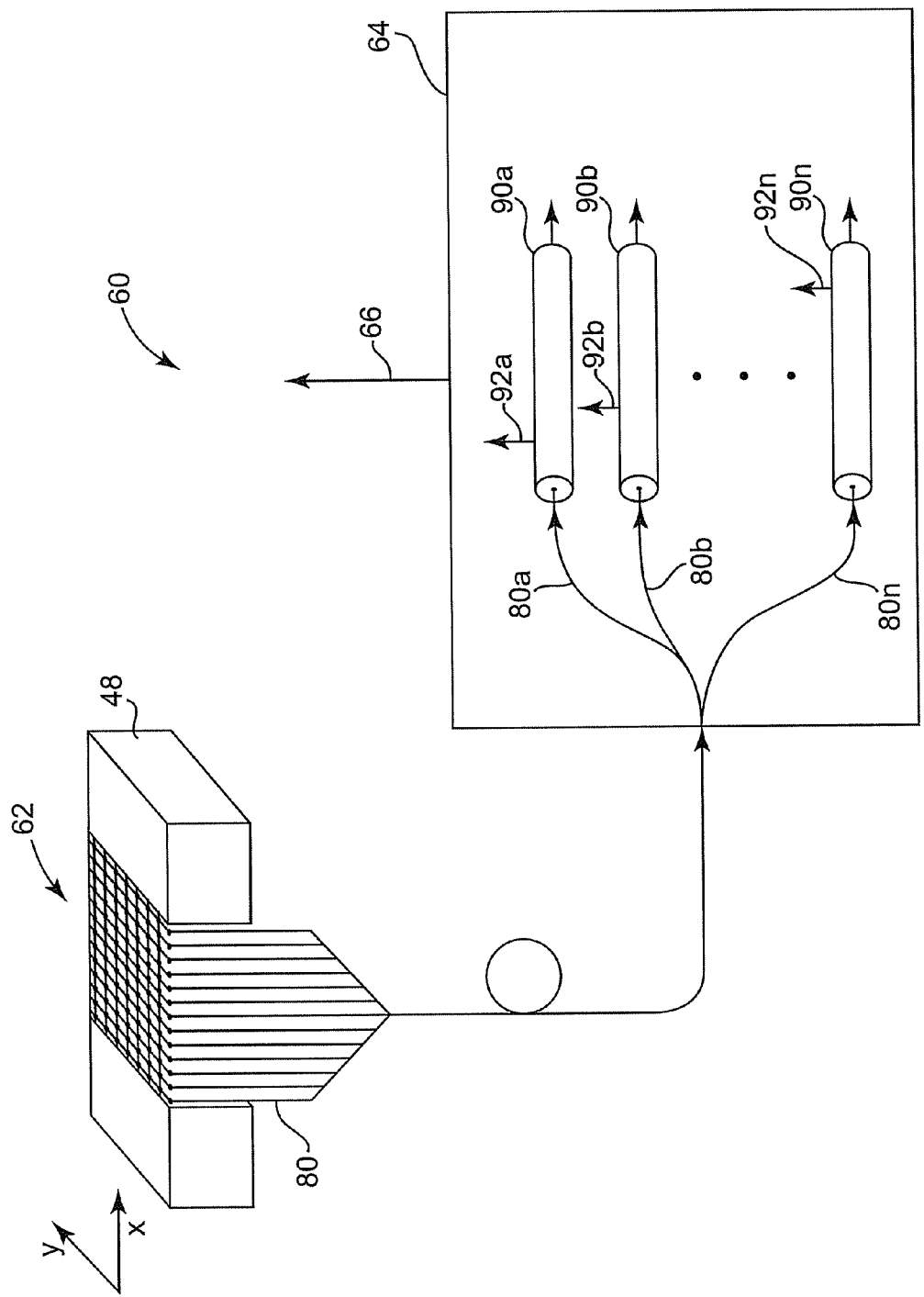
FIG. 4 is a block and schematic diagram illustrating generally an illumination monitor according to one embodiment.
Figure 5:
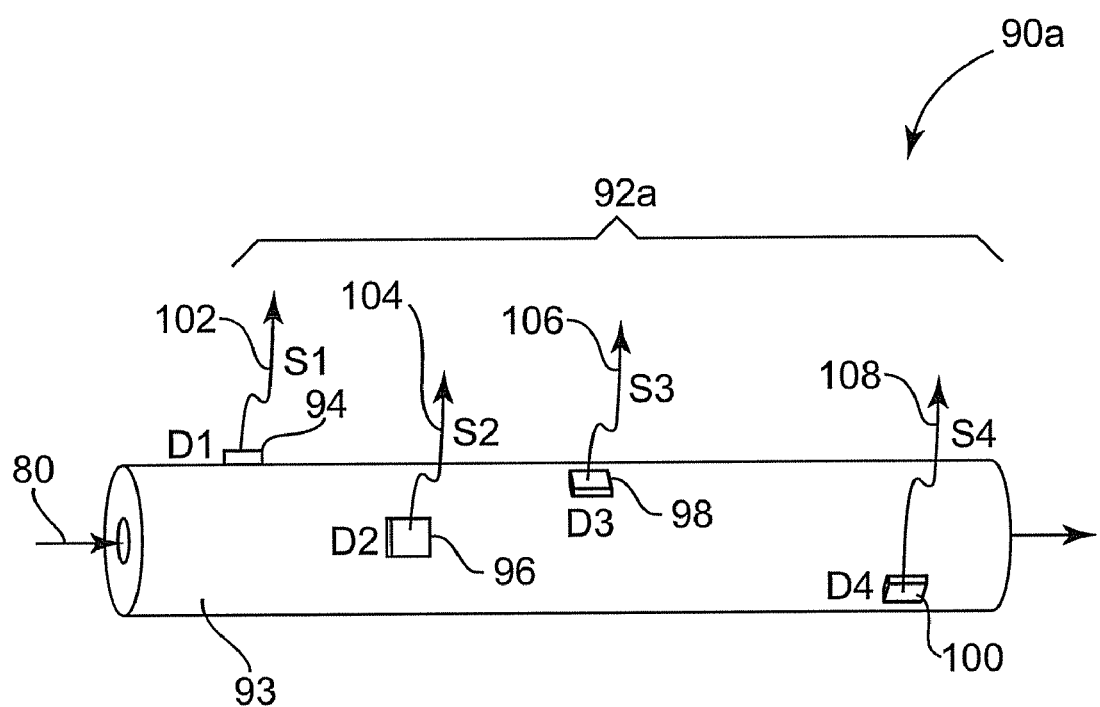
FIG. 5 is a block diagram generally illustrating one embodiment of a polarimeter suitable to be adapted for use with the lithographic system of FIG. 1.

FIGS. 3 through 5 describe embodiments of wafer plane illumination monitor 60. FIG. 3 is top view of a portion of wafer stage 48 illustrating receiver 62. In one embodiment, as illustrated by FIG. 2, receiver 62 comprises a plurality of optical fibers, such as illustrated by optical fiber 80, having ends which are positioned so as to be substantially flush with surface 50 of wafer stage 48. In one embodiment, receiver 62 is rectangular in shape with dimensions (or boundaries) d1 82 and d2 84 (e.g. substantially equal to those of dies 56), and with optical fibers 80 disposed in a matrix-like fashion in the x- and y-directions. In one embodiment, optical fibers 80 are positioned within vacuum holes in wafer stage 48 with their ends substantially flush with surface 50.

In one embodiment, optical fibers 80 comprise a single mode optical fiber. In one embodiment, optical fibers 80 include a fiber cladding with 100% internal reflection. In general, a diameter of optical fibers 80 cannot be smaller than a wavelength of exposure beam 72 (e.g. 193 nm). In one embodiment, as an illustrative example, each die 56 has a dimension of 10×10 mm such that receiver 62 has dimensions d1 82 and d2 84 of 10 mm. If optical fibers 80 having a diameter of 100 µm are employed, approximately up to 10,000 optical fibers 80 could be positioned within the boundaries of receiver 62. In one embodiment, fibers 80 have a minimum diameter of 0.2 µm so that fibers 80 are able to receive the minimum wavelength currently utilized by lithography processes.

FIG. 4 is a schematic diagram illustrating one embodiment of illumination monitor 60 with receiver 62 comprising a plurality of optical fibers, illustrated as optical fibers 80a to 80n, as described above with respect to FIG. 3. Each of the optical fibers 80 receives and provides a discrete sample of monitor beam 74 to polarimeter 64. In one embodiment, polarimeter 64 includes a plurality of in-line, all-fiber polarimeters, illustrated as polarimeters 90a to 90n, with one in-line, all-fiber polarimeter 90 corresponding to each optical fiber 80 and receiving the discrete sample of monitor beam 74 from the corresponding optical fiber 80. As illustrated below, each of the in-line, all-fiber polarimeters 90 provides a plurality of illumination signals, illustrated as illumination signals 92a to 92n, each being indicative of the properties of the corresponding sample of monitor beam 74. Illumination signals 92a to 92n together represent the plurality of illumination signals 66 provided by polarimeter 64.

FIG. 5 is a block diagram generally illustrating one example of in-line, all-fiber polarimeter, such as polarimeter 90a, which is suitable to be adapted for use with polarimeter 64. All-fiber type polarimeters are known in the art, and polarimeter 90a as illustrated by FIG. 5 is similar to an in-line, all-fiber polarimeter described and illustrated by U.S. Pat. No. 6,211,957. It is noted that, in addition to that illustrated by FIG. 5, other types of polarimeters, including other types of fiber polarimeters, are available and suitable to be adapted for use as polarimeter 64.

As illustrated by FIG. 5, in-line, all-fiber polarimeter 90a includes an optical fiber 93 having detectors D1 94, D2 96, D3 98, and D4 100 positioned along its length. Each detector D1 to D4 has a corresponding grating internal to optical fiber 93 (not illustrated), each of which is configured to out-couple to its corresponding detector D1 to D4 a different polarization at a predetermined intensity of the discrete sample of exposure beam 72 received by all-fiber polarimeter 90 via corresponding optical fiber 80 of receiver 62. For example, in one embodiment, detector D1 94 receives and measures linear-polarized light at 0-degrees from its corresponding grating to provide a first illumination signal 102, detector D2 96 receives and measures linear-polarized light at 90-degrees from its corresponding grating to provide a second illumination signal 104, detector D3 98 receives and measures linear-polarized light at 45-degrees from its corresponding grating to provide a third illumination signal 106, and detector D4 100 receives and measures linear-polarized light at 135-degrees from its corresponding grating to provide a fourth illumination signal 108.

The four illumination signals S1 102 through S4 108 are representative of the polarization state of the discrete sample of exposure beam 72 received by optical fiber 80 of receiver 62. The desired Stokes parameters which, as know in the art, can be used to measure and define the polarization state of light, along with the intensity and phase of the discrete sample of exposure beam 72, can be determined from illumination signals S1 102 through S4 108, such as by controller 54. In one embodiment, the four illumination signals S1 102 through S4 108 represent the plurality of illumination signals 92a. The above is repeated for each optical fiber 80, such that the illumination signals S1 through S4 provided by all of the all-fiber polarimeters 90 of polarimeter 64 together represent the plurality of illumination signals 66 provided by polarimeter 64.

In one embodiment, controller 54 receives each plurality of illumination signals 92a to 92n from the corresponding fiber polarimeter 90a to 90n and determines the properties, as described above, for each of the samples of monitor beam 74 provided by optical fibers 80a to 80n of receiver 62. In one embodiment, similar to that described above, controller 54 adjusts parameters of lithographic system 30 based on the determined properties of monitor beam 74 so as to form a metrology or production parameter feedback loop. In one embodiment, controller 54 determines and saves properties of the light of each sample of monitor beam 74 provided by illumination monitor 60 with the saved parameters being used for engineering/production analysis.

Figure 6:
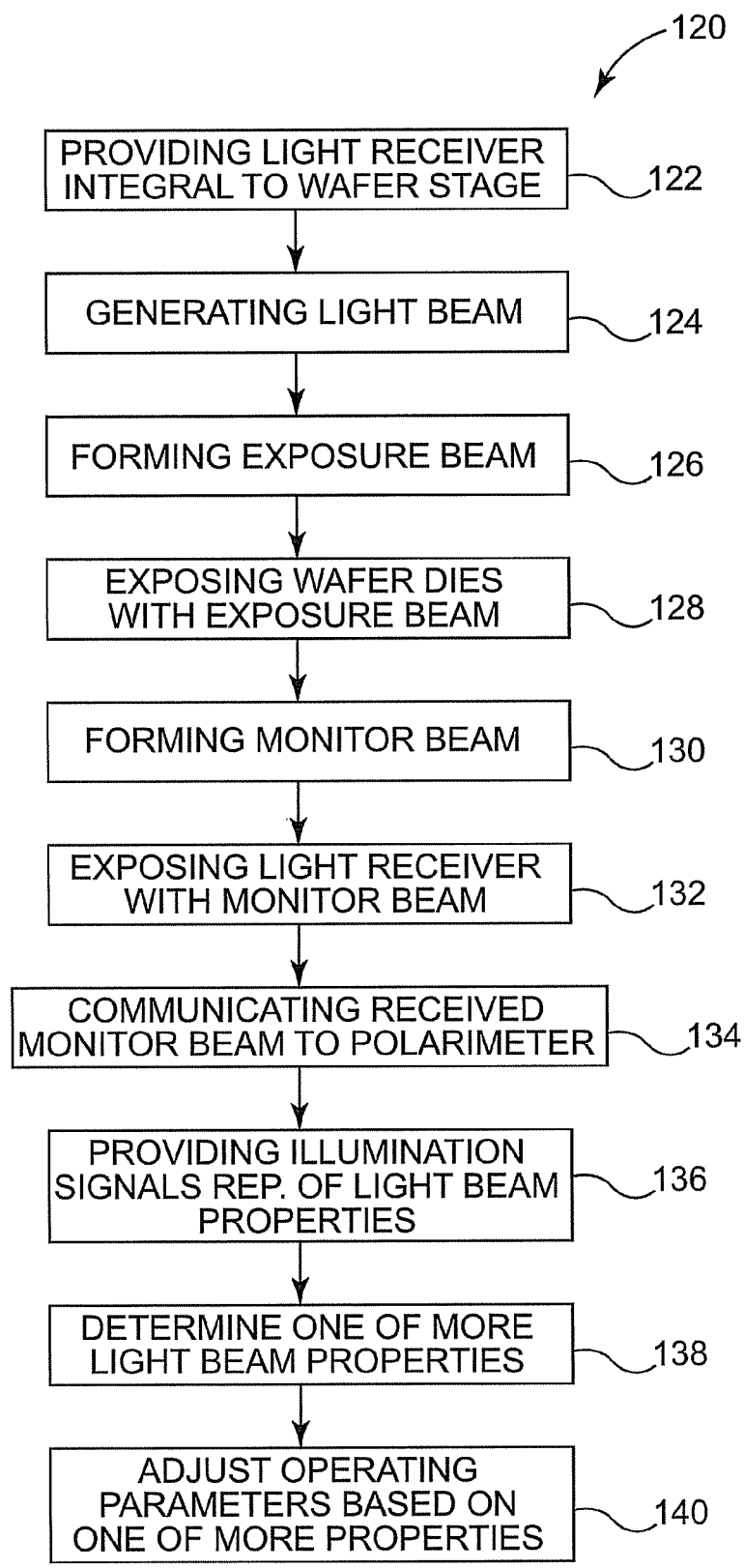
FIG. 6 is a flow diagram illustrating generally a method of fabricating a semiconductor according to one embodiment.

FIG. 6, with reference to FIGS. 1-5, is a flow diagram illustrating one embodiment of a process 120 for operating a lithographic system, such as lithographic system 30. Process 120 begins at 122 by providing a light receiver integral to and substantially flush with a surface of a wafer stage, such as wafer stage 48. In one embodiment, the light receiver comprises a plurality of optical fibers having their ends positioned so as to be flush with the surface of the wafer stage, with each such end configured to receive light incident thereon. In one embodiment, as described above with respect to FIGS. 3-5, the ends of the optical fibers as positioned in a grid-like or matrix-like fashion.

At 124, a light beam is provided or generated, such as by light source 32, which is subsequently shaped, directed, and focuses, including its being passed through a mask pattern, to form an exposure beam, such as exposure beam 72, as indicated at 126. At 128, each die of a plurality of dies, such as dies 56 of wafer 52 are exposed with the exposure beam so as to image the mask pattern thereon.

At 130, process 120 includes shaping, directing, and focusing the light beam to form a monitor beam, such as monitor beam 74. In one embodiment, forming the monitor beam includes passing the light beam through the mask pattern such that the monitor beam is substantially the same as the exposure beam at 126. In one embodiment, forming the monitor beam includes bypassing the mask pattern, such as by directing the light beam through a clear quartz area of the mask or by bypassing the mask altogether.

At 132, the light receiver provided at 122 is exposed with the exposure beam formed at 130, with the exposure beam received by the light receiver being communicated to a polarimeter, as indicated at 134. In one embodiment, such as when the light receiver comprises a plurality of optical fibers as described above, light receiver provides a plurality of individual samples or portions) of the exposure beam to the polarimeter (e.g. one per each optical fiber).

At 136, based on the exposure beam received via the light receiver, the polarimeter provides a plurality illumination signals which are representative of one or more properties of the light beam as is passes through the lithographic system, including after its being formed into the exposure beam. In one embodiment, as described above, when the monitor beam is passed through the mask pattern, the polarimeter provides illumination signals which are representative of properties of diffracted light at the wafer surface. In one embodiment, when the monitor beam bypasses the mask pattern, the polarimeter provides illumination signals which are representative of light at the mask plane. In one embodiment, as described above by FIGS. 4-5, the polarimeter comprises a plurality of in-line, all-fiber polarimeters, with one polarimeter corresponding to each of the optical fibers of the light receiver provided at 122.

In one embodiment, as indicated by the dashed lines at 138, process 120 additionally includes determining one or more properties of the light beam based on the plurality of illumination signals provided at 136. For example, in one embodiment, a controller, such as controller 54, determines properties of the light beam, such as the polarization state, intensity, and across-exposure field distribution of the light incident upon the mask, such as described above. In one embodiment, as indicated at 140, the controller adjusts operating parameters of the lithographic system based on the determined properties of the light beam so as to form a feedback loop.

Although specific embodiments have been illustrated and described herein, it will be appreciated by those of ordinary skill in the art that a variety of alternate and/or equivalent implementations may be substituted for the specific embodiments shown and described without departing from the scope of the embodiments. This application is intended to cover any adaptations or variations of the specific embodiments discussed herein. Therefore, it is intended that the embodiments be limited only by the claims and the equivalents thereof.

What is claimed is:

1. A lithographic system comprising:
a light source configured to provide a light beam;
a mask stage configured to hold a mask having a mask pattern;
a wafer stage having a surface configured to hold a wafer having a plurality of dies, each die having a boundary defining an areal extent;
an illumination monitor including:
a receiver disposed at the surface of the wafer stage having an areal extent at least equal to the areal extent of the die; and
a polarimeter; and
a projection system configured to shape and direct the light beam, including via the mask pattern, to form an exposure beam including the mask pattern and with an areal extent equal to the areal extent of the die, configured to individually expose each die with the exposure beam, and configured to shape and direct the light beam to form a monitor beam having are areal extent equal to that of the exposure beam and to expose the receiver with the monitor beam, wherein the receiver is configured to communicate the monitor beam to the polarimeter which, based on the monitor beam, is configured to provide a plurality of illumination signals representative of one or more properties of the light beam as it passes through the lithographic system.

2. The lithographic system of claim 1, wherein one of the properties comprises a polarization state of the light beam.

3. The lithographic system of claim 1, wherein the monitor beam comprises the exposure beam.

4. The lithographic system of claim 3, wherein the illumination signals are representative of properties of diffracted light at a surface of the wafer.

5. The lithographic system of claim 1, wherein the projection system is configured to bypass the mask pattern when forming the monitor beam.

6. The lithographic system of claim 5, wherein the illumination signals are representative of properties of the light beam incident upon the mask.

7. The lithographic system of claim 1, wherein the receiver comprises a plurality of optical fibers, each having a first end positioned integral to and substantially flush with the surface of the wafer stage and each configured to receive a portion of the exposure beam, and each having a second end coupled to the polarimeter.

8. The lithographic system of claim 7, wherein the first ends are positioned so as to form a grid, with each first end being predetermined location within the grid, and wherein dimensions of the grid are substantially equal to dimensions of a die on the wafer.

9. The lithographic system of claim 7, wherein the polarimeter comprises a plurality of in-line, all-fiber polarimeters, each of the in-line fiber polarimeters coupled to a corresponding one of the optical fibers and configured to provide a plurality of illumination signals indicative of the properties of the portion of the exposure beam received therefrom.

10. The lithographic system of claim 1, further including a controller configured to determine one or more of the properties of the light beam based on the plurality of illumination signals.

11. The lithographic system of claim 1, wherein the controller is configured to adjust one or more operating parameters of the lithographic system based on the one or more determined properties.

12. A method of operating a lithographic system, the method comprising:
disposing a light receiver integral to and substantially flush with a surface of a wafer stage;
generating a light beam;
forming an exposure beam by shaping and focusing the light beam, including directing the light beam through a mask pattern of a mask such that the expose beam includes the mask pattern;
exposing with the exposure beam each die of a wafer positioned on the surface of the wafer stage, each die having a boundary defining an areal extent, the exposure beam having an areal extent equal to the areal extent of the die;
forming a monitor beam by shaping and focusing the light beam, the monitor beam having an area extent equal to that of the exposure beam;
exposing the light receiver with the monitor beam, the light receiver having an areal extent at least equal to the areal extent of the die; and
communicating the monitor beam via the receiver to a polarimeter;
providing via the polarimeter, and based on the monitor beam, a plurality of illumination signals representative of one or more properties of the light beam as it passes through the lithographic system, including after its being formed into the exposure beam.

13. The method of claim 12, including determining the one or more properties of the light beam from the plurality of illumination signals.

14. The method of claim 13, including adjusting one or more operating parameters of the lithographic system based on the one or more determined properties of the light beam so as to form feedback loop.

15. The method of claim 13, including storing the one or more determined properties of the light beam for production analysis.

16. The method of claim 12, wherein the monitor beam comprises the exposure beam, and wherein the illumination signals are representative of one or more properties of the exposure beam at a surface of the wafer.

17. The method of claim 12, wherein forming the monitor beam includes directing the light beam so as to bypass the mask pattern by directing the light beam through a clear quartz area of the mask or by bypassing the mask, and wherein the illumination signals are representative of one or more properties of the light beam incident upon a surface of the mask.

18. The method of claim 12, wherein disposing the light receiver includes positioning first ends of a plurality of optical fibers in a grid-like fashion so as to be integral to and substantially flush with the surface of the wafer stage and coupling second ends of the plurality of optical fibers to the polarimeter.

19. A lithographic system comprising:
a light source configured to provide a light beam;
a mask stage configured to hold a mask having a mask pattern;
a wafer stage having a surface configured to hold a wafer having a plurality of dies;
an illumination monitor including:
a plurality of optical fibers, each optical fiber having a first end, wherein the first ends of the plurality of optical fibers are disposed integral to and flush with the surface of the wafer stage and positioned in a grid-like fashion to form a light receiver beyond a perimeter edge of the wafer; and a plurality of fiberoptic polarimeters, one coupled to each optical fiber; and a projection system configured to shape and direct the light beam via the mask pattern to form an exposure beam and to individually expose each die with the exposure beam and to expose the receiver with the monitor beam, wherein each optical fiber forming the light receiver receiver is configured to communicate a portion of the exposure beam to the corresponding polarimeter which, wherein each polarimeter is configured to provide a plurality of illumination signals representative of one or more properties of the exposure beam as it exposes the wafer dice.

20. The lithographic system of claim 19, wherein the diameter of each of the optical fibers is at least equal to a wavelength of the exposure beam.

21. The lithographic system of claim 7, wherein each die has an areal extent of 10×10 millimeters and each of the optical fibers has a diameter of 100 microns, and wherein the plurality of optical fibers comprise 10,000 optical fibers arranged in a grid-like fashion within an areal extent of 10×10 millimeters to form the receiver.

* * * * *